(12) United States Patent
Lee

(10) Patent No.: US 6,221,778 B1
(45) Date of Patent: Apr. 24, 2001

(54) METHOD OF FABRICATING A SEMICONDUCTOR DEVICE

(75) Inventor: Yun-Jae Lee, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/368,166

(22) Filed: Aug. 5, 1999

(30) Foreign Application Priority Data

Aug. 10, 1998 (KR) .................................................. 98-32459

(51) Int. Cl.$^7$ .................................................. H01L 21/311
(52) U.S. Cl. .......................... 438/696; 438/702; 438/740
(58) Field of Search ................................... 438/689, 690, 438/696, 702, 740, 763

(56) References Cited

U.S. PATENT DOCUMENTS

| | | | |
|---|---|---|---|
| 5,141,884 | * 8/1992 | Kwon et al. | 437/41 |
| 5,900,666 | * 5/1999 | Gardner et al. | 257/401 |
| 5,933,741 | * 8/1999 | Tseng | 438/305 |
| 5,972,760 | * 10/1999 | Ju | 438/305 |
| 5,989,966 | * 11/1999 | Huang | 438/305 |

* cited by examiner

Primary Examiner—Robert Kunemund
Assistant Examiner—Kin-Chan Chen
(74) Attorney, Agent, or Firm—The Law Offices of Eugene M. Lee, PLLC

(57) ABSTRACT

A method of fabricating semiconductor device, which reduces amount of oxidization on semiconductor substrate to suppress volume expansion of an active region of a semiconductor substrate, thereby removing pits on the semiconductor substrate. A conductive layer for forming a gate electrode and a first insulating layer serving as a mask are sequentially formed on the semiconductor substrate. Using a mask for forming a gate electrode, the first insulating layer and the conductive layer are sequentially etched to form a gate electrode. A second insulating layer and a third insulating layer are formed on the structure of the gate electrode and the surface of the semiconductor substrate. A third insulating layer formed on an overall surface of the semiconductor substrate is dry etched to form an insulating layer spacer on sidewalls of the gate electrode. A fourth insulating layer is formed on the structure of the semiconductor substrate and the gate electrode by a deposition process. That is, after forming an insulating layer spacer on sidewalls of the gate electrode, an oxide layer is formed by a deposition process so as to compensate for damage.

10 Claims, 3 Drawing Sheets

METHOD OF FABRICATING A SEMICONDUCTOR DEVICE

BACKGROUND OF THE INVENTION

1. Field of the Invention

The present invention relates to a method of fabricating a semiconductor device and, more particularly, to an oxidation process in forming a gate electrode of a semiconductor device.

2. Description of the Related Art

Referring to FIG. 1A, a device isolation region 12 defining an active region and an inactive region is formed on a semiconductor substrate 10. A polysilicon layer 14a, a tungsten silicide layer 14b, and a mask nitride layer 14c are sequentially formed on a gate oxide layer (not shown) on the semiconductor substrate 10.

Using a mask for forming a gate electrode, the mask nitride layer 14c, the tungsten silicide layer 14b, and the polysilicon layer 14a are sequentially etched to form a gate electrode. In order to compensate for damage generated on an upper portion and both sidewalls of the gate electrode 14 and the semiconductor substrate 10 during formation of the gate electrode 14, a first oxide layer 16 is formed on the semiconductor substrate 10 and the gate electrode 14 by a thermal oxidation process.

Referring to FIG. 1B and FIG. 1C, a nitride layer 18 is formed over the entire surface of the semiconductor substrate 10 and the first oxide layer 16. The nitride layer 18 is then etched back to form a nitride layer spacer 18a on sidewalls of the gate electrode 14. In order to compensate for damage generated on the gate oxide layer and the semiconductor substrate 10 during dry etch for forming the nitride layer spacer 18a, a second oxide layer 20 is formed on the semiconductor substrate 10 and the gate electrode 14 by the thermal oxidation process.

Owing to the first oxide layer 16 and the second oxide layer 20, the amount of oxidization of the active region of the semiconductor substrate 10 is increased to expand the volume. Owing to the expansion of the volume, the active region is attacked to generate pit-type defect 22 such as a pit. This may generate the fail, thereby reducing the yield of products.

SUMMARY OF THE INVENTION

The present invention is directed to overcoming or at least reducing the effect of the problem set forth above.

A feature of the present invention is to provide a method for fabricating a semiconductor device that volume expansion of an active region of a semiconductor substrate is suppressed to remove pit-type defects.

These and other features of this invention are accomplished by forming a plurality of spaced-apart gate electrodes with a capping insulator thereon on a semiconductor substrate, growing an oxide layer by a thermal oxidation process on the semiconductor substrate including the gate electrodes, forming a nitride layer on the thermal oxide layer, etching the nitride layer to form a spacer on sidewalls of the gate electrodes; and depositing a CVD oxide layer. The CVD oxide layer may be made of a high temperature oxide. The method may further comprise forming an etching stopper nitride layer on the CVD oxide layer, depositing a second oxide layer to fill spaces between the gate electrodes, and etching the second oxide, the etching stopper nitride, and the thermal oxide layers to form contacts exposing the semiconductor substrate between the gate electrodes, wherein the CVD oxide layer serves as a buffer layer between the semiconductor substrate and the etching stopper nitride layer.

According to this invention, a conductive layer for forming a gate electrode and a first insulating layer are sequentially formed on a semiconductor substrate wherein an active region and an inactive region are defined. Using a mask for forming a gate electrode, the first insulating layer and the conductive layer are sequentially etched to form a gate electrode. A second insulating layer and a third insulating layer are sequentially formed on the gate electrode and a surface of the semiconductor substrate. The third insulating layer is dry etched to form an insulating layer spacer on sidewalls of the gate electrode. Finally, a fourth insulating layer is formed on the structure of the semiconductor substrate including the gate electrode by a deposition process. That is, after forming an insulating layer spacer on sidewalls of the gate electrode, a high temperature oxide layer is formed by a deposition process so as to compensate for damage at the surface of the semiconductor device. As a result, amount of oxidization is reduced to suppress volume expansion of the active region of the semiconductor substrate, thereby effectively removing pits from the semiconductor device.

BRIEF DESCRIPTION OF THE DRAWINGS

The above feature and advantages of the invention will become apparent upon reference to the following detailed description of specific embodiments and the attached drawings, of which.

DETAILED DESCRIPTION OF THE SPECIFIC EMBODIMENT

Figure 1A:
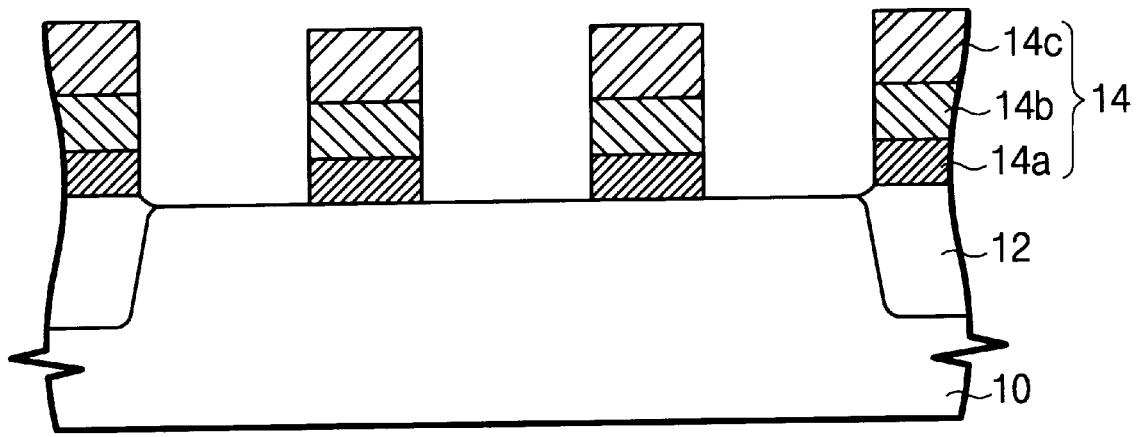
FIGS. 1A, 1B, and 1C are cross-sectional views showing the process steps of a prior method for fabricating a semiconductor device.
Figure 1B:
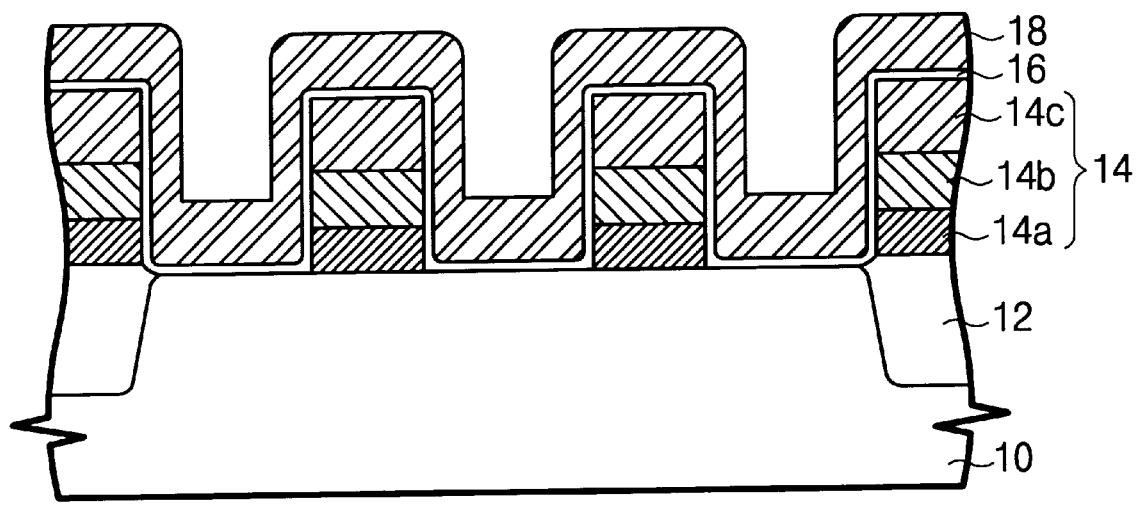
Figure 1C:
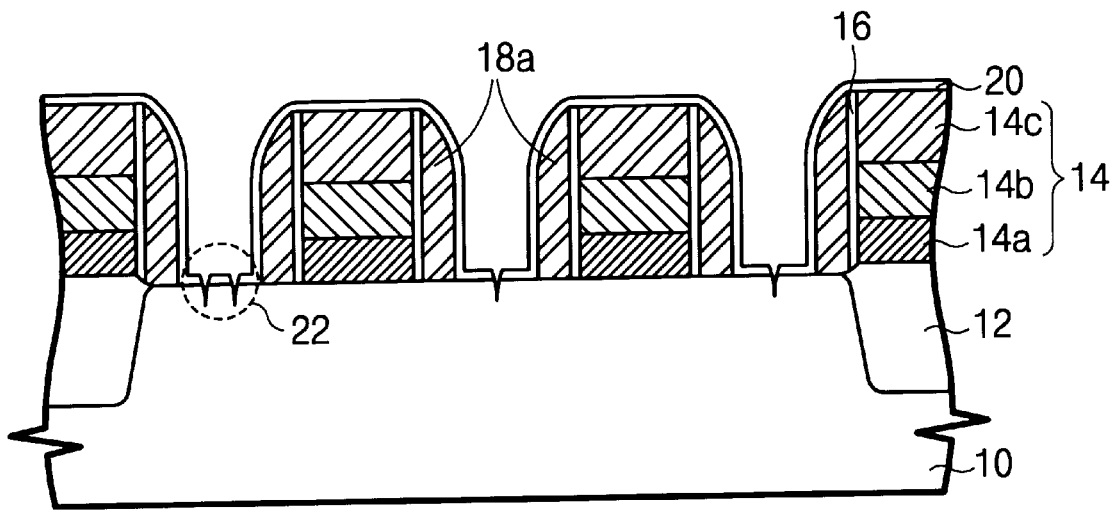

Korean application no. 98-32459, filed on Aug. 10, 1998, is hereby incorporated by reference as if fully set forth herein.

The present invention will now be described in greater detail in conjunction with preferred or exemplary embodiments with reference to the accompanying drawings. This invention may, however, be embodied in different forms and should not be construed as limited to the embodiments set forth herein. In the drawings, the thickness of layers and regions are exaggerated for clarity. It will also be understood that when a certain layer is referred to as being "on" or "above" a second layer or substrate, the certain layer can be directly on or above the second layer or substrate and intervening layers may also be present. In contrast, when an element is referred to as being "directly on" or "directly above" another element, there are no intervening elements present. Analogous definitions are intended for the words "below" and "under." Moreover, each embodiment described and illustrated herein includes its complementary conductivity type embodiment as well.

Figure 2A:
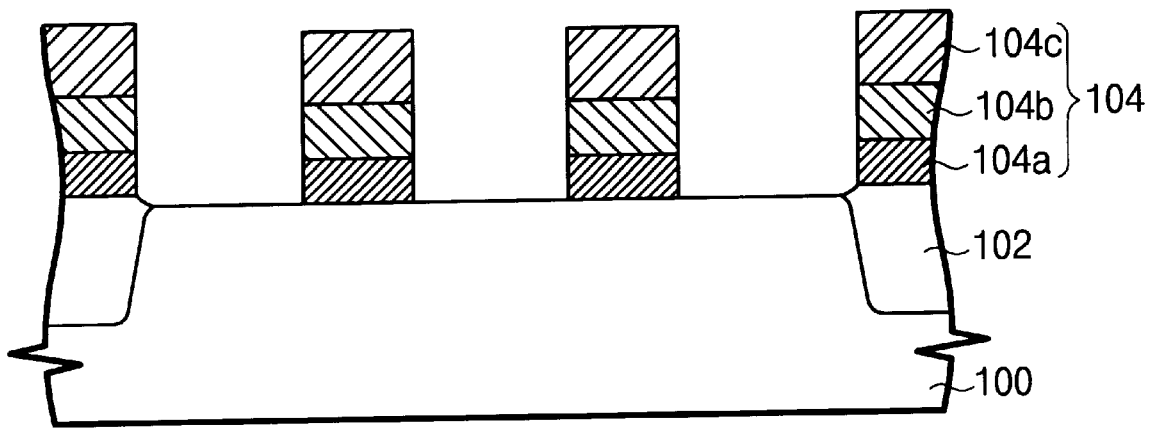
FIGS. 2A, 2B, and 2C are cross-sectional views showing the process steps of a novel method for fabricating a semiconductor device in accordance with the present invention.

Referring to FIG. 2A, a device isolation region 102 defining an active region and an inactive region is formed on a semiconductor substrate 100 by a conventional LOCOS (local oxidation of silicon) process or a trench isolation process. A polysilicon layer 104a, a tungsten silicide layer 104b, and mask nitride layer 104c are sequentially formed on a gate oxide layer (not shown) on the semiconductor substrate 100.

Figure 2B:
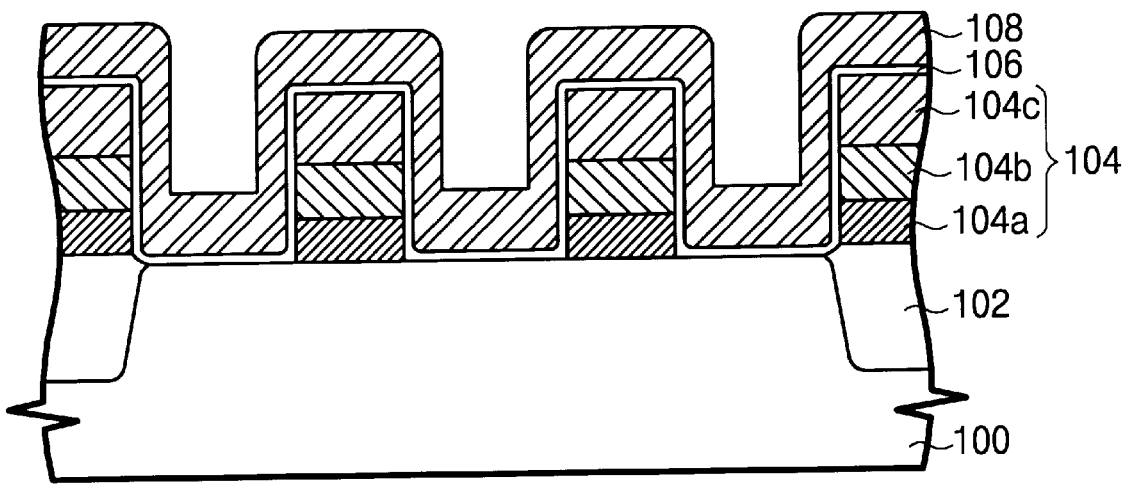
Figure 2C:
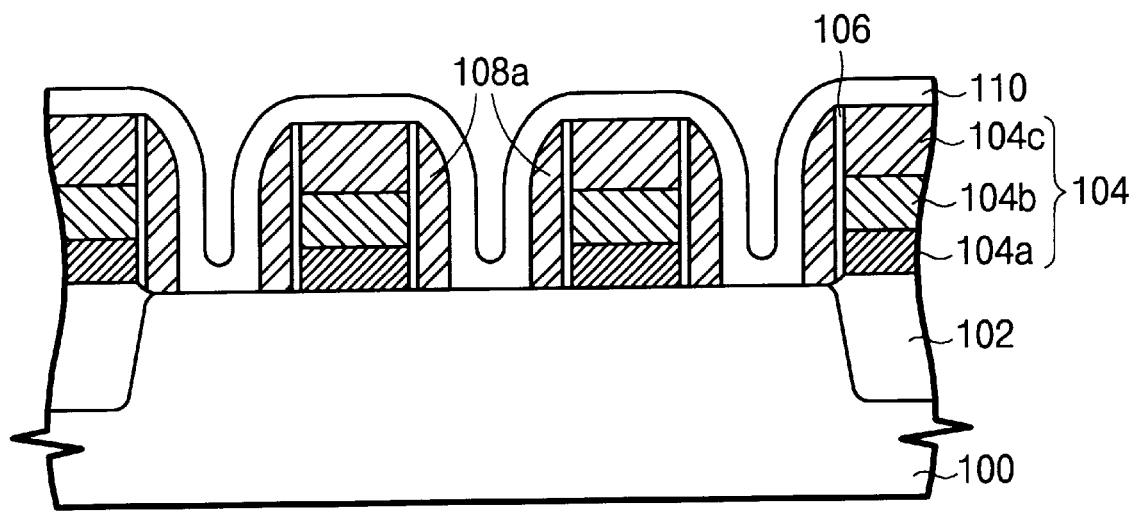

Using a mask for forming a gate electrode, the mask nitride layer 104c, a tungsten silicide layer 104b, and a polysilicon layer 104a are sequentially etched to form a gate electrode 104. The mask nitride layer 104c is served as an etch-stop layer while etching an interlayer insulating film in the following self-aligned contact process. In order to compensate for damage generated on an upper portion and sidewalls of the gate electrode 104 and the semiconductor substrate 100 while the gate electrode 104 is formed, a first oxide layer 106 is formed on the semiconductor substrate 100 and the gate electrode 104 by a thermal oxidation process as shown in FIG. 2B. A nitride layer 108 is formed on the first oxide layer 106, as shown in FIG. 2C. The nitride layer 108 is then etched back to form a nitride layer spacer 108a on sidewalls of the gate electrode 104, as shown in FIG. 2C.

Referring to FIG. 2C, a second oxide layer 110 is formed on a semiconductor substrate 100 and the gate electrode 104 by a deposition process instead of an oxidation process. Since the second oxide layer 110 is made of high temperature oxide (HTO) and is formed by the deposition process, the amount of oxidization of the semiconductor substrate is reduced such that volume expansion of the active region of the semiconductor substrate will be decreased. The second oxide layer 110 is used as a buffer layer of the mask nitride layer 104c, the nitride layer spacer 108a, and the semiconductor substrate 100.

In the present invention, after forming a nitride layer spacer on both sidewalls of a gate electrode, an oxide layer is formed not by an oxidization process but by a deposition process so as to compensate for damage at the surface of a semiconductor device. As a result, amount of oxidization is reduced to suppress volume expansion of an active region of a semiconductor substrate, thereby effectively removing pits from semiconductor device.

Thus, a method of fabricating a semiconductor device has been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

We claim:

1. A method for fabricating a semiconductor device comprising the steps of:

forming a plurality of spaced-apart gate electrodes with a capping insulator thereon on a semiconductor substrate;

growing an oxide layer by a thermal oxidation process on the semiconductor substrate including the gate electrodes;

forming a nitride layer on the thermal oxide layer;

etching the nitride layer to form a spacer on sidewalls of the gate electrodes;

depositing a CVD oxide layer;

forming an etching stopper nitride layer on the CVD oxide layer;

depositing a second oxide layer to fill spaces between the gate electrodes; and etching the second oxide, the etching stopper nitride, and the thermal oxide layers to form contacts exposing the semiconductor substrate between the gate electrodes, wherein the CVD oxide layer serves as a buffer layer between the semiconductor substrate and the etching stopper layer.

2. The method according to claim 1, wherein the CVD oxide layer is made of a high temperature oxide.

3. A method of fabricating a semiconductor device comprising the steps of:

sequentially forming a conductive layer for forming a gate electrode and a first insulating layer on a semiconductor substrate wherein an active region and an inactive region are defined;

sequentially etching the first insulating layer and the conductive layer by using a mask for forming a gate electrode to form a gate electrode;

forming a second insulating layer on the gate electrode and the surface of the semiconductor substrate;

forming a third insulating layer on the second insulating layer;

etching the third insulating layer to form an insulating layer spacer on sidewalls of the gate electrode;

forming a fourth insulating layer on the semiconductor substrate and the gate electrode by a deposition process;

forming an etching stopper nitride layer on the fourth insulating layer;

depositing an additional oxide layer to fill a spaces adjacent the gate electrode; and etching the additional oxide, the etching stopper nitride, and the fourth insulating layers to form contacts exposing the semiconductor substrate adjacent the gate electrode, wherein the fourth insulating layer serves as a buffer layer between the semiconductor substrate and the etching stopper nitride layer.

4. The method of claim 3, wherein the conductive layer has a structure that a tungsten silicide layer and a polysilicon layer are sequentially formed on a gate oxide layer on the semiconductor substrate.

5. The method of claim 3, wherein the first insulating layer is made of nitride.

6. The method of claim 3, wherein the second insulating layer is made of oxide.

7. The method of claim 6, wherein the fourth insulating layer is used as a buffer layer of the first insulating layer, the second insulating second layer, and the semiconductor substrate.

8. The method of claim 3, wherein the second insulating layer is made by a thermal oxidation process.

9. The method of claim 3, wherein the third insulating layer is made of nitride.

10. The method of claim 3, wherein the fourth insulating layer is made of high temperature oxide.

* * * * *